US011593610B2

(12) United States Patent
Anderson et al.

(10) Patent No.: US 11,593,610 B2
(45) Date of Patent: Feb. 28, 2023

(54) AIRPORT NOISE CLASSIFICATION METHOD AND SYSTEM

(71) Applicant: Metropolitan Airports Commission, Minneapolis, MN (US)

(72) Inventors: Derek Anderson, Lakeville, MN (US); Matthew Baker, Woodbury, MN (US); Nicholas Heller, Minneapolis, MN (US); Bradley Juffer, Eagan, MN (US)

(73) Assignee: METROPOLITAN AIRPORTS COMMISSION, Minneapolis, MN (US)

( * ) Notice: Subject to any disclaimer, the term of this patent is extended or adjusted under 35 U.S.C. 154(b) by 879 days.

(21) Appl. No.: 16/386,603

(22) Filed: Apr. 17, 2019

(65) Prior Publication Data

US 2019/0332916 A1    Oct. 31, 2019

Related U.S. Application Data

(60) Provisional application No. 62/662,590, filed on Apr. 25, 2018.

(51) Int. Cl.
*G10L 25/30* (2013.01)
*G10L 25/51* (2013.01)
(Continued)

(52) U.S. Cl.
CPC ......... *G06N 3/0418* (2013.01); *G06F 16/904* (2019.01); *G06F 16/906* (2019.01);
(Continued)

(58) Field of Classification Search
CPC ... G06N 3/0418; G06F 16/904; G06F 16/906; G06F 16/909; G06K 9/0055;
(Continued)

(56) References Cited

U.S. PATENT DOCUMENTS 8,059,489 B1 * 11/2011 Lee .................. G01N 29/46
                                                    367/136
9,412,382 B2    8/2016 Schroeter
(Continued)

OTHER PUBLICATIONS

Serizel, Romain et al., "Acoustic Features for Environmental Sound Analysis", HAL Archives-ouvertes.fr, Nov. 16, 2017.
(Continued)

*Primary Examiner* — Fariba Sirjani
(74) *Attorney, Agent, or Firm* — Fox Rothschild LLP

(57) ABSTRACT

An aircraft noise monitoring system uses a set of geographically distributed noise sensors to receive data corresponding to events captured by the noise sensors. Each event corresponds to noise that exceeds a threshold level. For each event, the system will receive a classification of the event as an aircraft noise event or a non-aircraft noise event. It will then use the data corresponding to the events and the received classifications to train a convolutional neural network (CNN) in a classification process. After training, when the system receives a new noise event, it will use the CNN to classify the new noise event as an aircraft noise event or a non-aircraft noise event, and it will generate an output indicating whether the new noise event is an aircraft noise event or a non-aircraft noise event.

18 Claims, 12 Drawing Sheets

(51) Int. Cl.
*G06N 3/04* (2023.01)
*G06F 16/906* (2019.01)
*G06F 16/909* (2019.01)
*G06F 16/904* (2019.01)
*H03G 3/32* (2006.01)

(52) U.S. Cl.
CPC ............ *G06F 16/909* (2019.01); *G10L 25/30* (2013.01); *G10L 25/51* (2013.01); *H03G 3/32* (2013.01)

(58) Field of Classification Search
CPC ........... G10L 25/30; G10L 25/51; H03G 3/32; G08G 5/0026; G08G 5/0082
See application file for complete search history.

(56) References Cited

U.S. PATENT DOCUMENTS

| | | | |
|---|---|---|---|
| 9,595,260 | B2 | 3/2017 | Shen et al. |
| 10,733,465 | B2* | 8/2020 | Wang ................... G06V 20/56 |
| 10,878,837 | B1* | 12/2020 | Guo ........................ H04S 7/40 |
| 11,194,330 | B1* | 12/2021 | Martin ................... G10L 25/30 |
| 11,227,626 | B1* | 1/2022 | Krishnan Gorumkonda ............... G10L 25/84 |
| 2012/0197612 | A1* | 8/2012 | Drews ..................... G01H 3/10 702/199 |
| 2018/0136350 | A1* | 5/2018 | Dell'Aversana ......... G01V 1/32 |
| 2018/0233152 | A1 | 8/2018 | Olaya et al. |
| 2018/0286428 | A1* | 10/2018 | Seider ..................... G06F 3/048 |
| 2018/0300865 | A1* | 10/2018 | Weiss ...................... G06T 7/001 |
| 2019/0114849 | A1* | 4/2019 | Lee .......................... G06N 5/04 |
| 2019/0228313 | A1* | 7/2019 | Lee ........................ G06N 3/088 |
| 2019/0234976 | A1* | 8/2019 | Giera ................ G01N 15/1475 |
| 2019/0259378 | A1* | 8/2019 | Khadloya ............... G06F 9/542 |
| 2019/0266446 | A1* | 8/2019 | Gorban ................ G06N 3/0454 |
| 2019/0311731 | A1* | 10/2019 | Haines ................... H04R 3/005 |
| 2019/0385583 | A1* | 12/2019 | Muggleton .......... H04R 1/1083 |
| 2020/0293840 | A1* | 9/2020 | Kang .................... G06N 3/0454 |
| 2020/0357516 | A1* | 11/2020 | Kirby ..................... G16H 50/20 |

OTHER PUBLICATIONS

LeCun, Yann et al., "Gradient-Based Learning Applied to Document Recognition", PROC. of the IEEE, Nov. 1998.

Salamon, J. et al., "Deep Convolutional Neural Networks and Data Augmentation for Environmental Sound Classification," IEEE Signal Processing Letters, vol. 24, No. 3, Mar. 2017, pp. 279-283.

Dorfler, M. et al., "Inside the Spectrogram: Convolutional Neural Networks in Audio Processing," 2017 International Conference on Sampling Theory and Applications, pp. 152-155.

Piczak, Karol, "Environmental Sound Classification with Convolutional Neural Networks," 2015 IEEE International Workshop on Machine Learning for Signal Processing, Sep. 17-20, 2015.

Meyer, Matthias et al., "Efficient Convolutional Neural Network for Audio Event Detection", ARXIV. Org, Cornell University Library, 201 Olin Library Cornell University Ithaca, NY, Sep. 28, 2017.

Maijala, Panu et al., "Environmental noise monitoring using source classification in sensors", Applied Acoustics, vol. 129, Jan. 1, 2018, pp. 258-267.

Khardi, S., "An Experimental Analysis of Frequency Emission and Noise Diagnosis of Commercial Aircraft on Approach", Journal of Acoustic Emission, Jan. 1, 2008, pp. 290-310.

Boddapati et al., "Classifying environmental sounds using image recognition networks", Procedia Computer Science (2017) 112: 2048-2056.

* cited by examiner

AIRPORT NOISE CLASSIFICATION METHOD AND SYSTEM

RELATED APPLICATIONS AND CLAIM OF PRIORITY

This patent application claims priority to U.S. Provisional Patent Application No. 62/662,590, filed Apr. 25, 2018, the disclosure of which is fully incorporated into this document by reference.

BACKGROUND

Air travel is one of the fastest growing modes of transportation. However, the effects of aircraft noise on populations surrounding airports is the primary cause of adverse community reaction related to the operation and growth opportunities at airports. These effects are especially prevalent near airports due to high densities of aircraft flying at low altitudes in such areas. It has become commonplace for major airports to have hundreds of arrivals or departures per day, which can result in hundreds of aircraft-related noise events where the sound pressure level (SPL) exceeds 65 decibels (dB) in nearby populated areas.

For these reasons, considerable investment has been made into reducing the amount of sound that aircraft produce, and in mitigating noise near airports through strategic runway selection, noise abatement flight procedures, residential sound insulation programs and outreach strategies. In planning and evaluating the effectiveness of these noise abatement strategies, efficient monitoring of the aircraft noise affecting areas around major airports is crucial.

In an effort to study and ultimately mitigate the impact from aircraft related noise, many airports continuously monitor the aircraft sounds in their surrounding communities by using aircraft noise and operations monitoring systems (NOMS) that include sound monitoring stations spread throughout the surrounding neighborhoods of an airport. An example of is shown in FIG. 1, which will be described below.

However, sound monitoring and analysis is complicated by the fact that aircraft are not the only source of sound and noise. For example, lawnmowers, vehicles, snowplows, fireworks, wind and thunder are non-aircraft events commonly collected by sound monitoring stations. It is important to be able to reliably identify these non-aircraft sound events to ensure highest quality and accuracy of metrics and reporting. To classify non-aircraft sound events as compared to aircraft sound events captured by sound monitoring stations, a process is utilized to evaluate whether an aircraft was in the vicinity when a sound event is recorded. This process, however, does not know, understand or take into consideration the source of the sound. Some airports attempt to check the aircraft correlated sound events manually by listening to audio recordings and examining historical flight path data, when available. This is a tedious and inefficient process, which is why this process is typically applied to only a very small fraction of total sound events collected.

This document describes methods and systems that are directed to solving some or all of the issues described above.

SUMMARY

In various embodiments, an aircraft noise monitoring system includes a set of geographically distributed noise sensors that capture sound events from an environment that is near an airport. A noise classification system will receive data corresponding to events captured by the noise sensors, wherein each event corresponds to noise that exceeds a threshold level over at least a minimum period of time. The classification system will receive, for each event, a manual classification of the event as an aircraft noise event or a non-aircraft noise event, The classification system will use the data corresponding to the events and the manual classifications of the events to train a convolutional neural network (CNN) in a classification process. Then, when the classification system receives a new noise vent from one of the noise sensors, the classification system will use the CNN to classify the new noise event as an aircraft noise event or a non-aircraft noise event, and it will generate an output indicating whether the new noise event is an aircraft noise event or a non-aircraft noise event.

In some embodiments, the system may transform the data corresponding to the events and the manual classifications of the events into a set of visualizations. Then, when using the data corresponding to the events and the manual classifications of the events to train the CNN, the classification system use the visualizations to train the network in a classification process. Also, when using use the CNN to classify the new event, the classification system may apply the CNN to the visualization of the new event.

For example, if the visualization of the new noise event comprises a visualization of sound pressure level of the noise event over a time window, then when using the CNN to classify the new noise event as an aircraft noise event or a non-aircraft noise event the system may determine whether the visualization of the sound pressure level of the noise event over the time window corresponds to an aircraft event. The system may determine whether the visualization of the sound pressure level of the noise event over the time window corresponds to an aircraft event by: (a) if the visualization exhibits a shape of a bell curve, determine that the visualization corresponds to an aircraft event; otherwise (b) determine that the visualization corresponds to a non-aircraft event.

If the visualization of the sound pressure level of the noise event over the time window comprises a three-dimensional visualization representing the sound pressure level on a first axis, time on a second axis, and frequency on a third axis, then when using the CNN to classify the new noise event as an aircraft noise event or a non-aircraft noise event the system may determine whether the visualization of the sound pressure level of the noise event over the time window corresponds to an aircraft event. To determine whether the visualization of the sound pressure level of the noise event over the time window corresponds to an aircraft event, the system may, if the visualization exhibits an oval spectral shape, determine that the visualization corresponds to an aircraft even; otherwise it may determine that the visualization corresponds to a non-aircraft event.

Before using the data corresponding to the events to train the CNN, the system may preprocess the data to yield sound events having a consistent length.

Optionally, the classification system also may receive an output of a softmax layer of the CNN and use the output of the softmax layer to determine a level of confidence as to whether the new noise event corresponds to an aircraft event.

BRIEF DESCRIPTION OF THE DRAWINGS

FIG. 6A illustrates a time history example of a sound event classified as "Aircraft," while

FIG. 7A illustrates a time history example of a sound event classified as "Non-Aircraft," while

DETAILED DESCRIPTION

Figure 1:
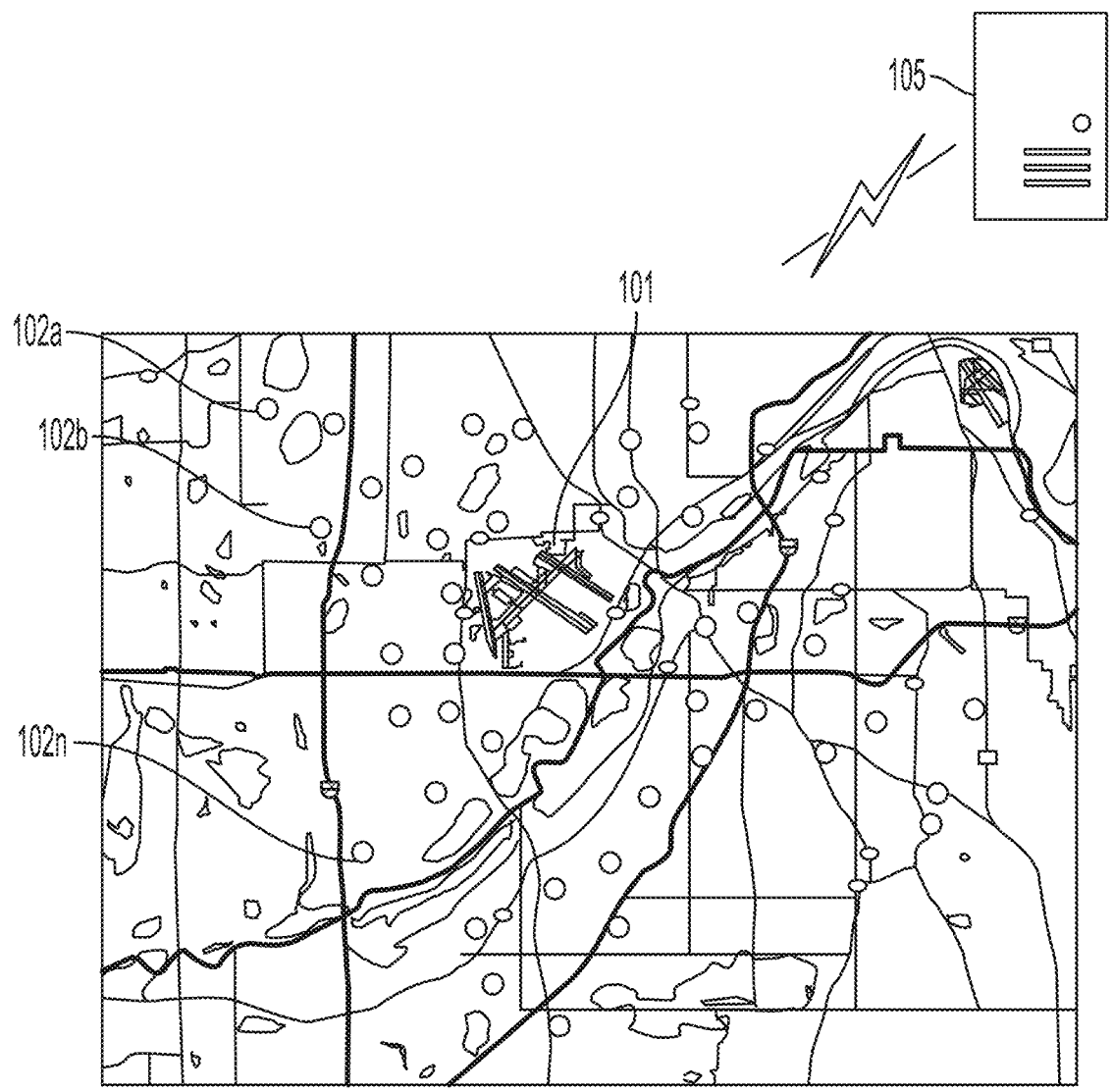
FIG. 1 is a map that illustrates an example of a distributed network of sound monitoring stations.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such as "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" may include values that are within +/−10 percent of the value.

The terms "server," "electronic device" and "computing device" refer to a device or system that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions. Examples of electronic devices include personal computers, servers, mainframes, virtual machines, containers, gaming systems, televisions, digital home assistants and mobile electronic devices such as smartphones, fitness tracking devices, wearable virtual reality devices, Internet-connected wearables such as smart watches and smart eyewear, personal digital assistants, cameras, tablet computers, laptop computers, media players and the like. Electronic devices also may include appliances and other devices that can communicate in an Internet-of-things arrangement, such as smart thermostats, refrigerators, connected light bulbs and other devices. Electronic devices also may include components of vehicles such as dashboard entertainment and navigation systems, as well as on-board vehicle diagnostic and operation systems. In a client-server arrangement, the client device and the server are electronic devices, in which the server contains instructions and/or data that the client device accesses via one or more communications links in one or more communications networks. In a virtual machine arrangement, a server may be an electronic device, and each virtual machine or container also may be considered an electronic device. In the discussion below, a client device, server device, virtual machine or container may be referred to simply as a "device" for brevity.

The terms "processor" and "processing device" refer to a hardware component of an electronic device that is configured to execute programming instructions. Except where specifically stated otherwise, the singular terms "processor" and "processing device" are intended to include both single-processing device embodiments and embodiments in which multiple processing devices together or collectively perform a process.

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

In this document, the terms "communication link" and "communication path" mean a wired or wireless path via which a first device sends communication signals to and/or receives communication signals from one or more other devices. Devices are "communicatively connected" if the devices are able to send and/or receive data via a communication link. "Electronic communication" refers to the transmission of data via one or more signals between two or more electronic devices, whether through a wired or wireless network, and whether directly or indirectly via one or more intermediary devices.

In this document, the term "sound" means the disturbance in atmosphere (air) medium that is capable of being detected and measured by acoustic instrument or human ear.

In this document, the terms "sound level" and "sound pressure level" mean a measured instantaneous or time-averaged sound pressure level. Sound pressure can be processed, measured, and stored in a single overall pressure or by frequency. Sound pressure levels may be reported in the unit of Decibels ("dB") and is reported using a base label of "L". Frequency filters may be applied to the sound pressure level ("A", "B", "C") which changes the base reporting by appending the filter used to the base level, for example "LA" or "LC".

The terms "sound monitor," "sound monitoring station," "sound level meter," "sound analyzer," "acoustics analyzer" and the like each refer to a device and related components capable of measuring sound pressure and displaying or storing sound pressure level and various metrics based on its capabilities and configuration.

The terms "sound event," "sound events," "noise event" and "noise events" are interchangeable and describe sounds that are of interest and reported using a base label of "E".

Sound events are defined as a specific period of time and frequency range and may contain metrics including the start time of the event ("$E_{stime}$"), the end time of the event ("$E_{etime}$"). Sound events may contain additional metrics such as maximum sound level measured ($LA_{max}$), the time when the maximum sound level was measured ($E_{mtime}$), level equivalency ($LA_{eq}$) and single event level ($LA_{sel}$). Sound events may also contain the time-history and frequency data of sound pressure levels through the duration of the event.

Figure 2:
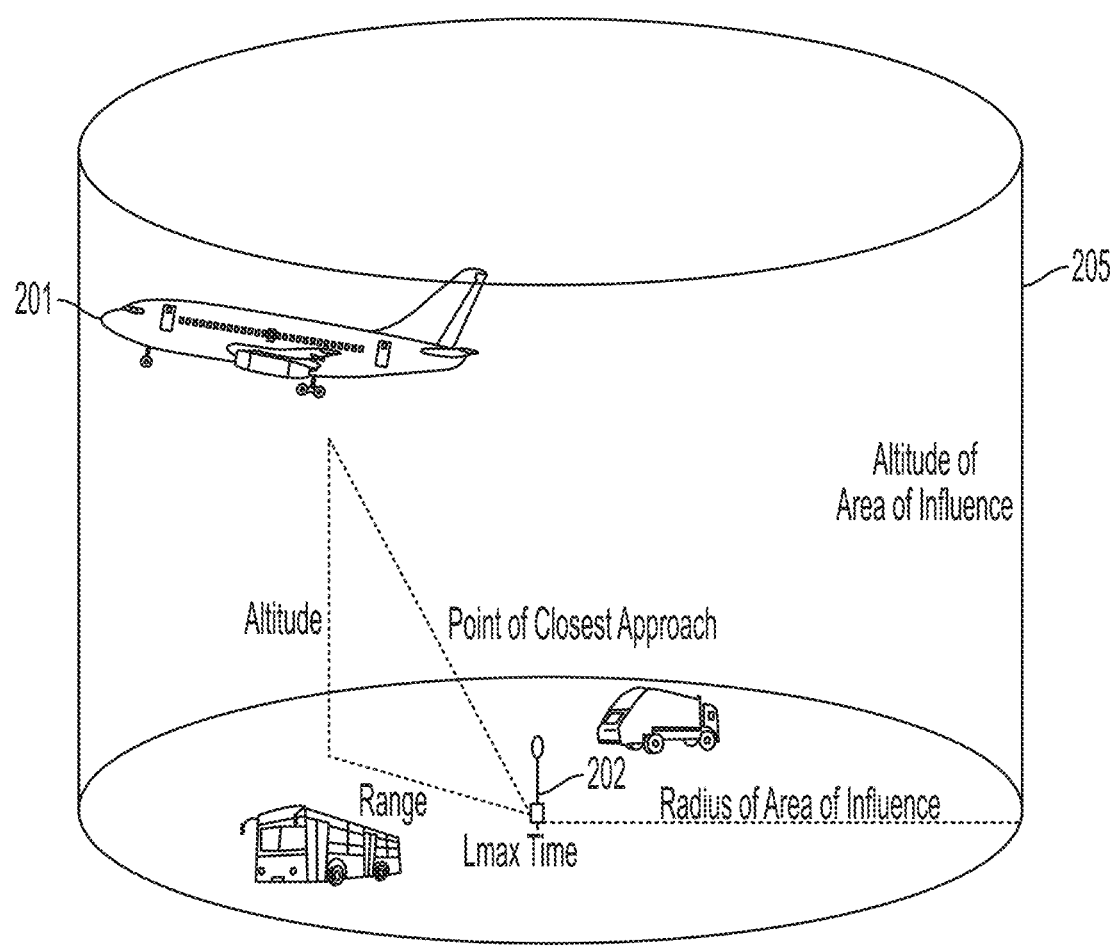
FIG. 2 illustrates the Point of Closest Approach (POCA) and "area of influence" concepts.

The term "point of closest approach" ("POCA") refers to the location at which two points are at their closest distance apart when one or more of the points are in motion. For example, as illustrated in FIG. 2, when an aircraft 201 flight path is at its closest to a stationary sound monitoring station 202 that is on the ground, the aircraft 201 may be considered to be at its POCA with respect to the sound monitoring station 202. When POCA is determined, additional metrics may be calculated such as the date and time and the three-dimensional distance between the two points.

Each sound monitoring station may be considered to have an "area of influence" 205, which is an area proximate to the station that can be thought of as a three-dimensional geometric shape (such as a cylinder or hemi-sphere) around the sound monitoring station. The size, shape and area of the area of influence can vary between sound monitoring stations to improve the classification results and can be based on various factors including its location in proximity to the airport, common aircraft POCA measurements, policies and standards, and other local variables.

Figure 3:
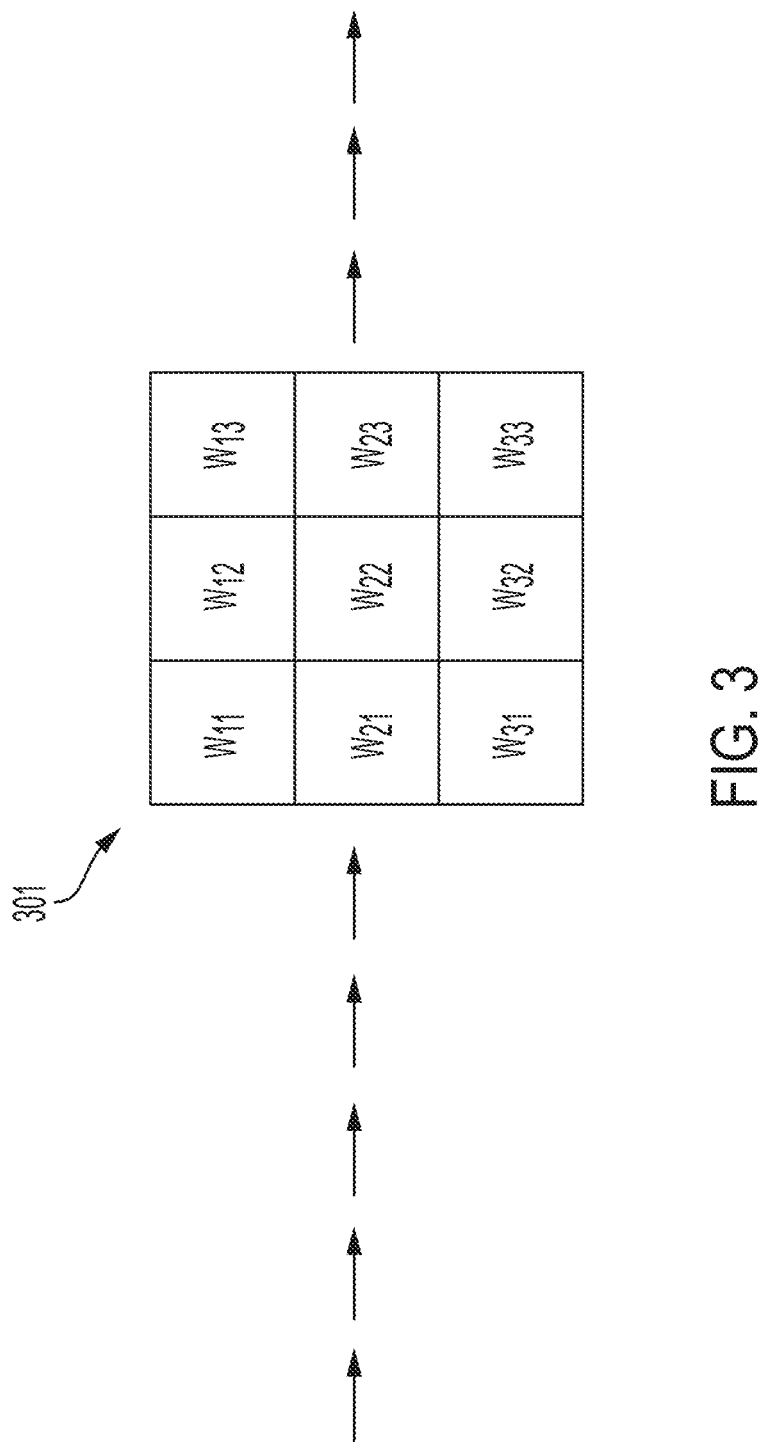
FIG. 3 is a matrix that illustrates the concept of convolution in the discussion below.

In machine learning, the central task is to choose a particular hypothesis from a hypothesis class. For instance, consider the simple example of binary classification in 1 dimension using a simple threshold, i.e. all numbers greater than the threshold are class 1, and all numbers less than the threshold are class two. Here, a hypothesis class is the set of all possible thresholds, and our task is to find the particular hypothesis, or threshold, which has the best performance. A "convolutional neural network" ("CNN") is a very large and sophisticated hypothesis class which is meant to be tailored toward hypotheses that make use of local image artifacts, performs downsampling to introduce spatial invariance, and then repeats this pattern some number of times. CNNs are represented by a computer as an ordered list of mathematical operations based on a large number of parameters. A feature central to these mathematical operations is the two-dimensional convolution. A simple illustration of this operation is shown in FIG. 3, which shows nine parameters arranged in a 3×3 window 301. This window slides along the image, and at each step an inner product is calculated between the parameters and the image values. This produces a new image as an output. This process is applied repeatedly in order to extract more and more abstract information from the data. Importantly, after each step the result of the inner product is subjected to some nonlinear function in order to expand the CNN's hypotheses to the space of nonlinear functions. Empirically, this has been shown to have a marked positive impact on their performance.

The process of selecting the best hypothesis out of the hypothesis class that a Convolutional Neural Network's parameters represent is referred to as training the CNN. In order to train a CNN, one must first define an objective function, which takes as input the output of the CNN as well as some known desired output, and produces a single number, usually thought of as a measure of badness, such that if the value of the objective function is high, the current hypothesis is a bad one. An important property of objective functions is that they must be differentiable. This is so that its gradient can be computed with respect to the parameters of the CNN in order to inform the search for better hypotheses. In the prior art, this is referred to as first-order nonlinear optimization.

To implement the airport noise classification method and system described in this document, a network of geographically distributed sound monitoring stations are positioned at various locations on or near an airport over which or near which aircraft are likely to fly. By way of example, as illustrated in FIG. 1, at the time of this filing the Metropolitan Airports Commission (MAC) operates a NOMS that includes 39 permanent sound monitoring stations 102a ... 102n spread throughout mostly residential neighborhoods surrounding the Minneapolis St. Paul International Airport 101. Each sound monitoring station 102a ... 102n includes sound collection equipment such as a sound analyzer, a preamplifier and a transducer such as a microphone. The transducer serves as a noise sensor for the system. By way of example, a sound monitoring station may include a Larson Davis 831 Sound Analyzer & Outdoor Preamp and Microphone System.

The sound analyzer at each sound monitoring station measures and stores sound levels utilizing slow response with A-weighting, for example as directed by the United States Federal Aviation Administration Regulations (14 CFR Part 150) or ISO 20906. Monitoring is typically performed continuously, although periodic monitoring is also within the scope of this disclosure.

The sound analyzer may identify sound or noise of interest, termed "sound events," through manual or automated methods. One automated method of identifying sounds events is when a sound level exceeds a threshold level for a minimum period of time. An example of this could be when a sound level continuously exceeds 65 dB for a minimum of 8 seconds. A continuation period or hysteresis may also be used to help identify a single noise event when sound pressure levels fluctuate at the threshold levels.

Figure 4:
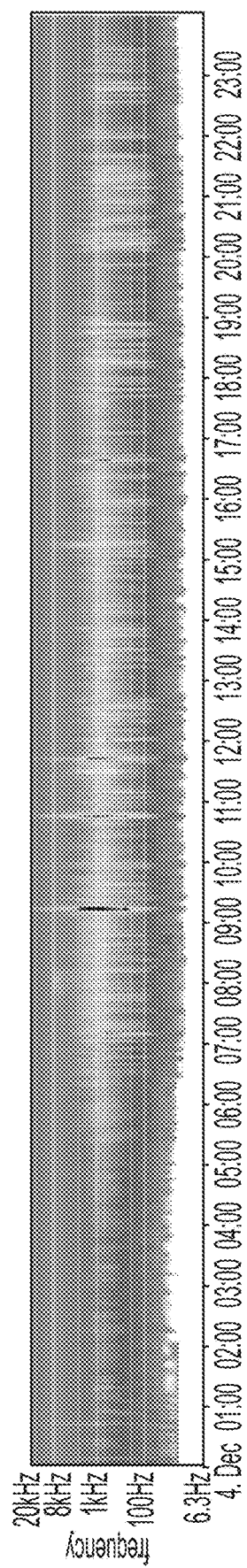
FIG. 4 illustrates an example stream of Sound Pressure Frequency (⅓ octave) data for a day.

In various embodiments, the sound monitoring station can collect and store the sound data stream continuously whereby sound events can be identified in a post-process manner at a central processing center. See FIG. 4 for an example graphical illustration of Sound Pressure Frequency (⅓ octave) data during a 24-hour period. In this example, a complete day is shown across the x-axis, while measured sound frequency is shown on the y-axis. If the illustration of FIG. 4 were in color, the z-axis, which corresponds to the sound pressure amplitude over time, could be represented by color.

In various embodiments, the sound monitoring stations can collect and store segments of the data (just sound events). In some embodiments, the sound monitoring station may collect and store sound pressure at periodic intervals and frequencies, such as every ⅓ octave from 6.3 Hz to 20,000 Hz.

As shown in FIG. 1, the sound monitoring stations 102a ... 102n may be in communication with a monitoring server 105, which is an electronic device that monitors the system, collects, stores and analyzes data collected by the sound monitoring stations. The sound monitoring stations may be in communication with the monitoring server via a wireless or wired communication link, with communications on a continuous, periodic or batch basis. Or, the sound monitoring stations 102a ... 102n may store data on a memory device for transport to the monitoring server 105 in batch form.

Figure 5:
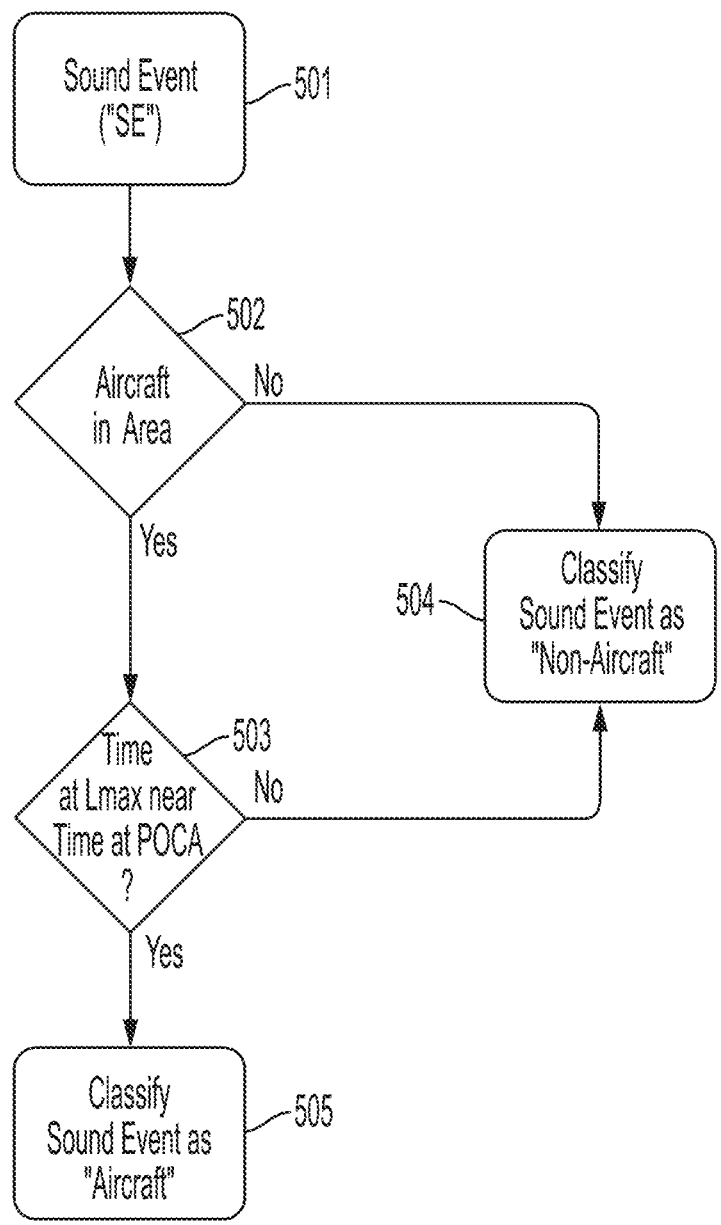
FIG. 5 illustrates a process by which a noise monitoring system may classify a sound event as being associated with an aircraft being proximate to a noise monitoring station, or with being associated with a non-aircraft event.
Figure 6A:
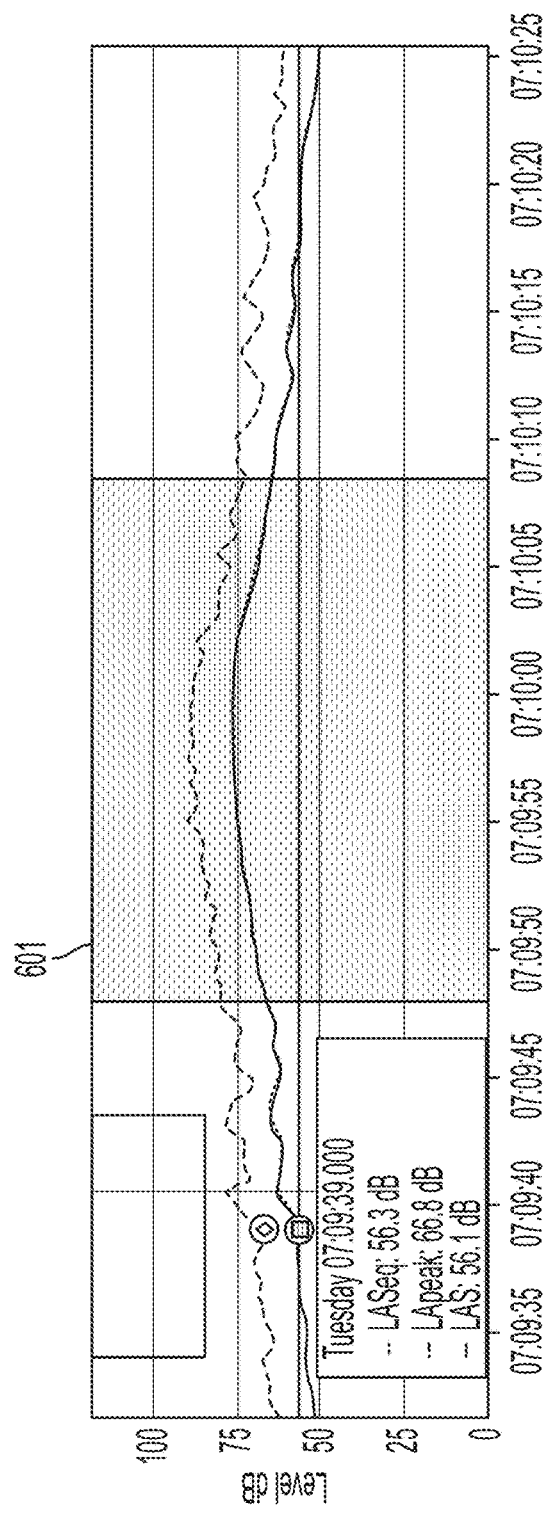
Figure 6B:
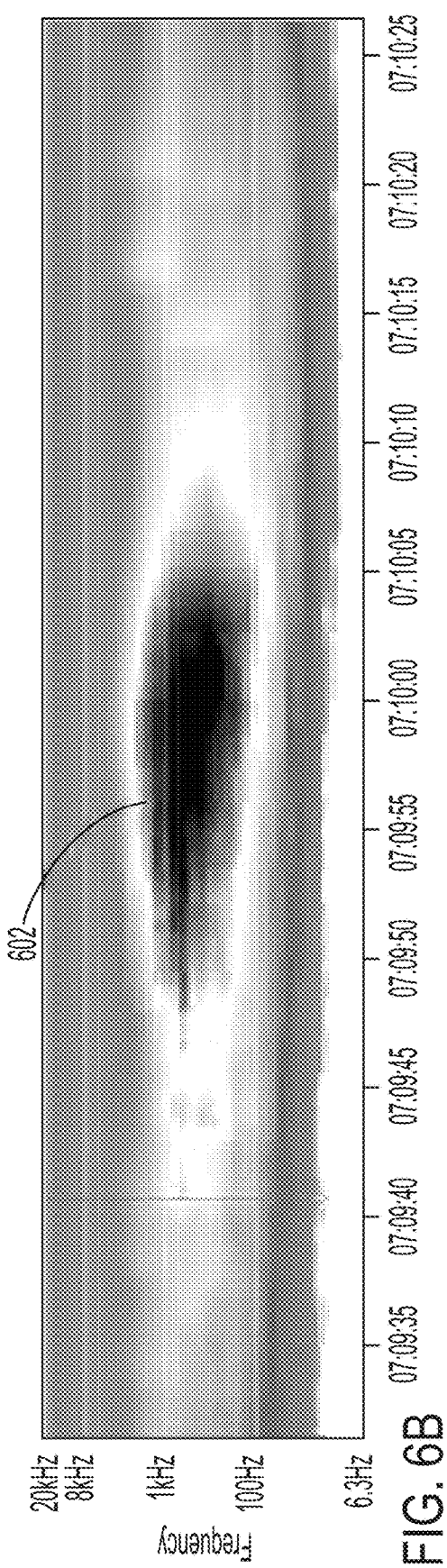
FIG. 6B illustrates a ⅓ Octave Band example of the same sound event.
Figure 7A:
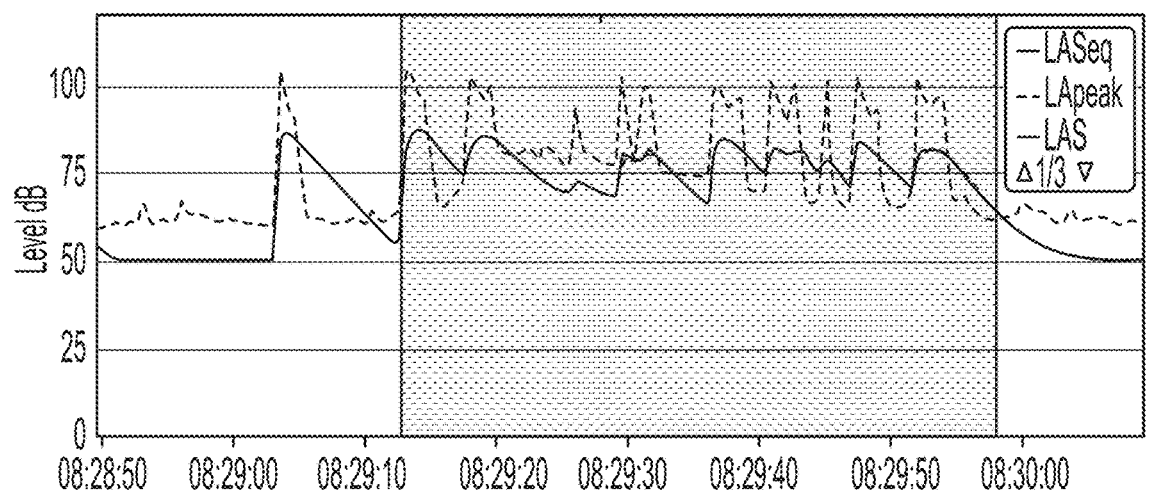
Figure 7B:
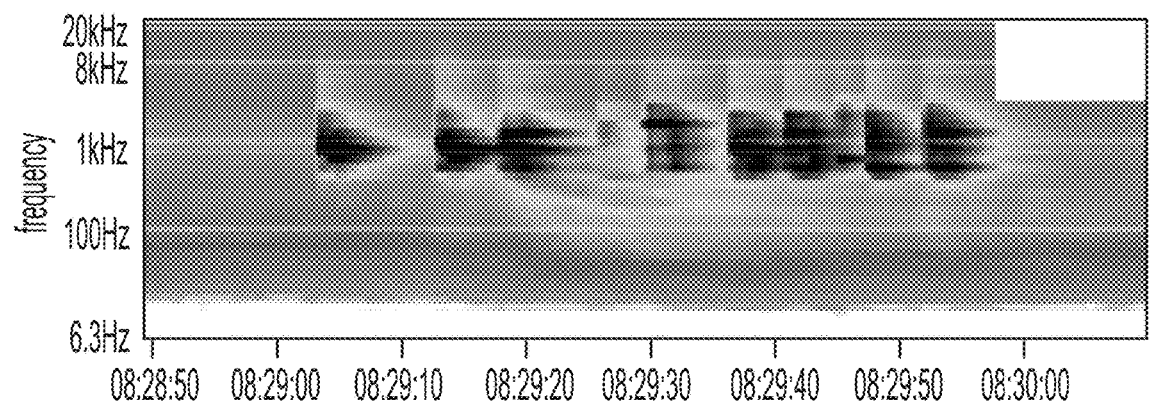
FIG. 7B illustrates a ⅓ Octave Band example of the same sound event.

FIG. 5 illustrates a process by which a system may classify sound events as being generated from an aircraft (e.g., with an "aircraft" label) or as being generated by other sources other than aircraft (e.g., with a "non-aircraft" label). By way of example, this classification process may consider spatial and temporal attributes of both the sound event and aircraft operation. An example process may start with an identified sound event measured by a sound monitoring station (step 501) and then evaluated to determine whether a sound event has characteristics that match a pattern that is associated with an aircraft event. For example, referring to FIG. 6A, a time history chart shows the Sound Pressure Level (LAS, LASeq) measured over a 60-second time period, with time on the x-axis and noise level in dB on the y-axis. Sound events produced by aircraft typically have a bell-shaped time history curve. Thus, the sound event depicted as being within time window 601 may be considered to be associated with an aircraft event. Alternatively or in addition, the system may consider a ⅓ Octave Band graphic as illustrated in FIG. 6B. (In this example, the time is on the x-axis and frequency is on the y-axis. The z-axis is the sound pressure amplitude and would be represented by color in a color image.) Sound events produced by aircraft typically have a smooth oval spectral shape 602, as depicted in the graphic. The system may initially classify a sound event with an aircraft label if it exhibits either of these characteristics, or it may require both characteristics and/or additional characteristics to be met in order to preliminarily classify an event as an aircraft event. In contrast, a time history chart and a ⅓ Octave Band graphic band graphic for a non-aircraft event are shown in FIGS. 7A and B, respectively.

Returning to FIG. 5, if the preliminary classification of a sound event is as an aircraft event, the system may then determine whether available aircraft flight path records indicate whether an aircraft was in a general area of the sound monitoring station during the time window of the sound event (step 502). If so, the system may more specifically determine whether the maximum sound pressure level of the sound event ($L_{max}$) occurred at a time when the aircraft was at or near (i.e., within a particular range of, as in the area of influence of FIG. 2) the time when the aircraft was at the POCA relative to the monitoring station (step 503). If the answer in either step 502 or step 503 is "no," then the system will classify the sound event as a non-aircraft event (step 504). If the answer in either step 502 or step 503 is "yes," then the system will classify the sound event as an aircraft event (step 505).

As illustrated above, such as in FIG. 6A, the temporal component of correlation uses a window or range of time 601 surrounding the time of maximum sound level recorded during a sound event. The correlation process uses a time range to account for time desynchronization between flight track and sound events as well as variances in sound arrival time due to environmental factors and flight characteristics. As illustrated above, the inventors have found that the spatial analysis of a sound event can be re-framed as an image recognition task.

In some embodiments, manual verification of sound events can be performed on classified sound events. However, human involvement in the classification process has significant limitations. For example, human verification is subjective to the individual experience and therefore prone to errors and less likely to achieve repeatable results between humans. In addition due to the limited capacity of human processing, it is impossible for humans to do this at any practical level. Only a very small percentage of sound events may go through manual verification due to staffing levels and task saturation. These problems may be exacerbated if the classification process uses an image recognition process such as that described above.

Figure 8:
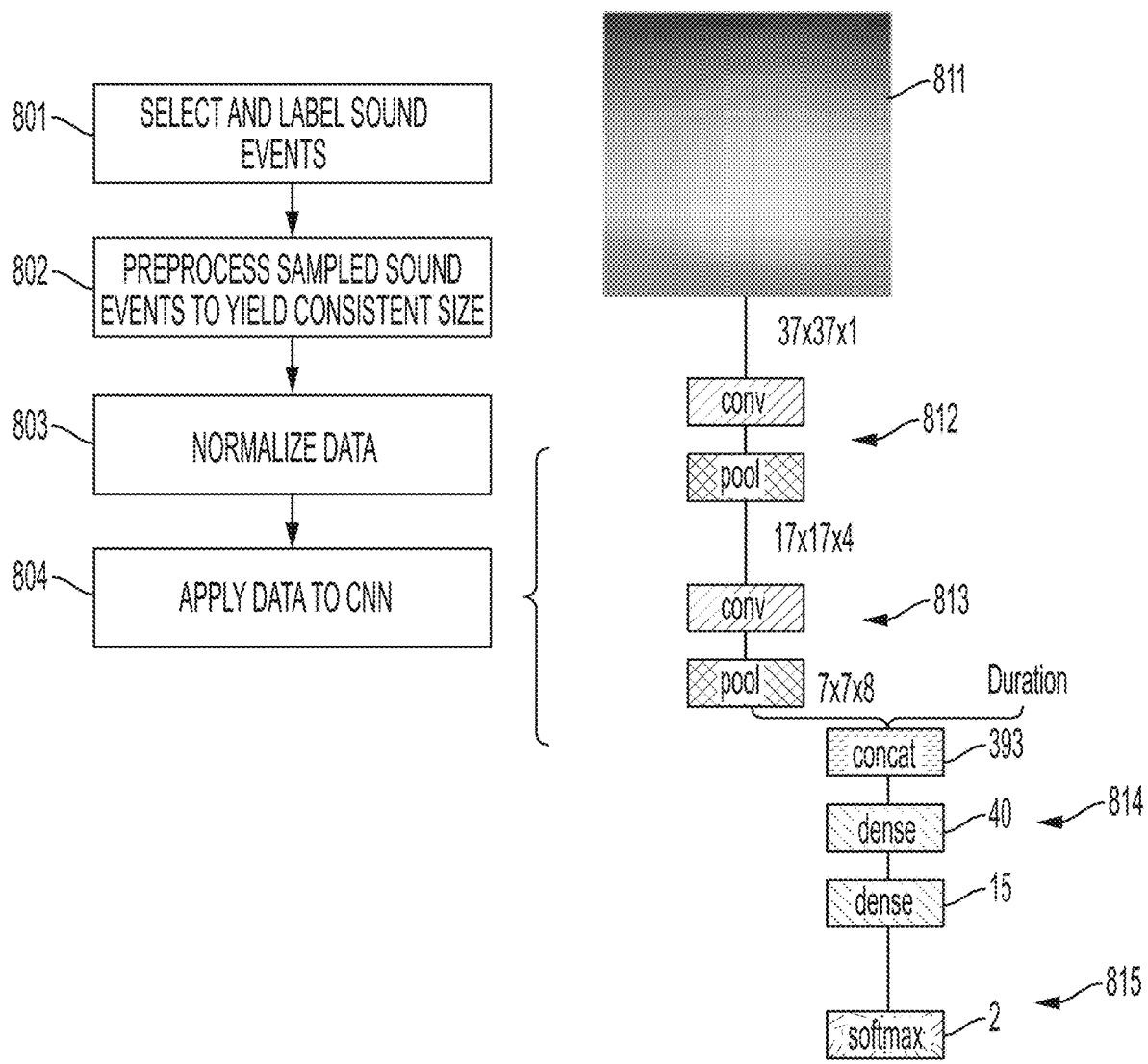
FIG. 8 illustrates an example convolutional neural network (CNN) training process.

An example training process is shown in FIG. 8. To create a set of training data to train the model, a group of these events may be selected at random and manually labelled with their true source (step 801), using human analysis. Manual labeling may be performed by a combination of matching these sound events with available flight path data and by listening to audio recordings of the events. By way of example, the inventors took a random sample of 900 sound events and manually labeled their true source (either aircraft or non-aircraft). Example sound events were sampled and labeled. Visualizations of the time history and 1/3 octave band data for a few of these events can be seen in 6A=B and 7A=B.

Figure 9:
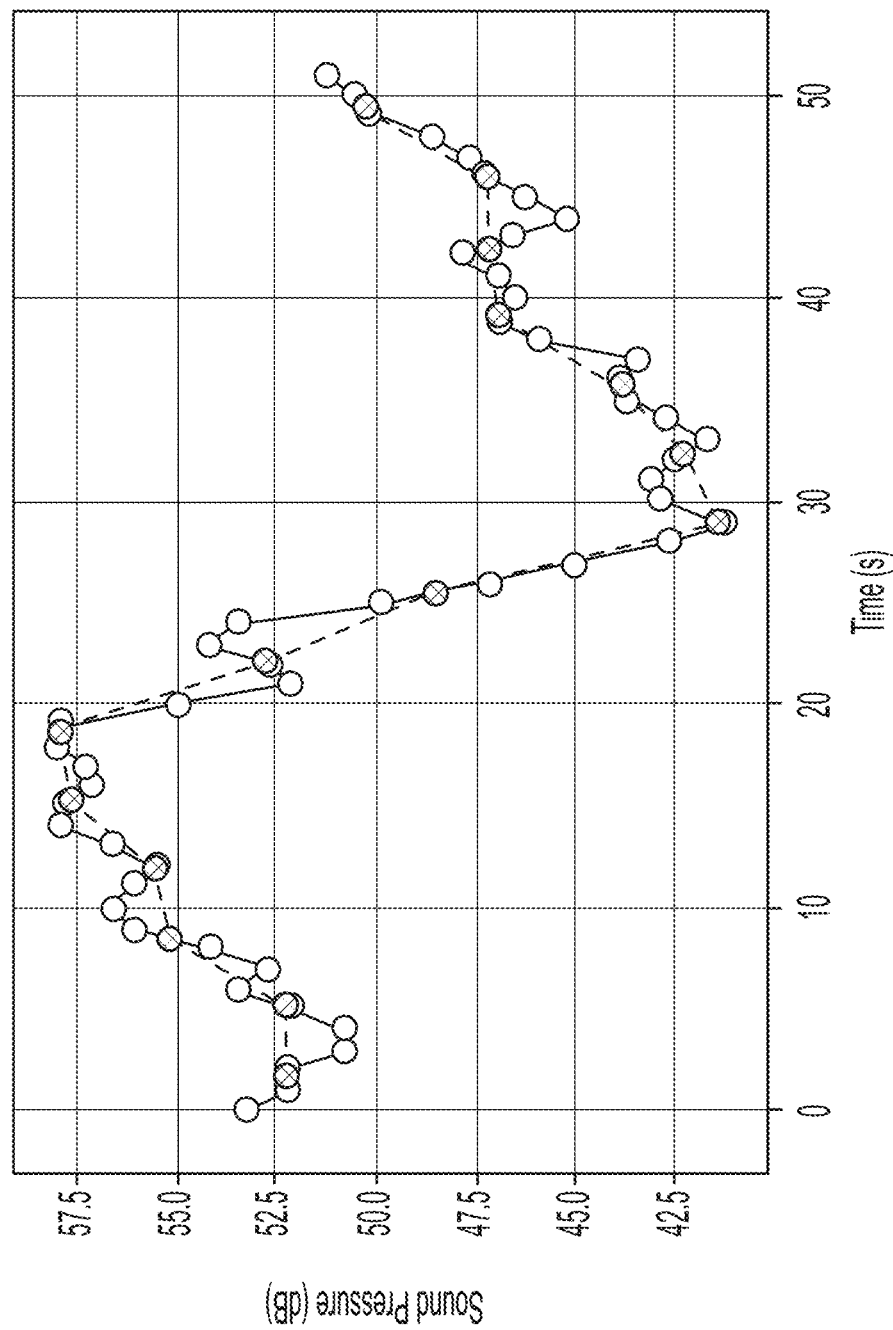
FIG. 9 illustrates an example sampling for an octave of a sound event.

In order to use a CNN for this task, the system may preprocess the sound measurements to transform the events having variable length into an object with a consistent length (step 802), which will become the input to the model. To this end, the system may use linear interpolation to uniformly sample from each time series (in an example, 36 ⅓ octave time series) for each event. An example sampling for a single octave of one event is shown in FIG. 9, which is an illustration of an interpolation procedure used on each ⅓ octave to map events to the same dimensionality. In order to preserve any predictive information that the event duration added, the system may store this in a memory as an added feature for classification, which may enter the network at the first dense layer.

Once this interpolation is performed and the duration is extracted, the system may normalize the octave data to have zero mean and unit standard deviation for numerical stability and reducing covariate shift (step 803).

In order to make classifications using natural images, a CNN makes the assumption that the relationships between pixels near each other in the image are more important to the discrimination task than pixels far from each other. In various embodiments, the inventors have found that this assumption holds true in images constructed for this task—that is, that the relationship between sound pressures near each other in time and frequency may be more important than those far from each other. This may be illustrated by the fact that the images generated (as in FIGS. 6A-B and 7A-B) appear distinct to humans, whose visual processes also exploit this assumption.

The system may implement a CNN using, for example, TensorFlow's Python API or any suitable system. Although not necessarily required, the model may be similar to LeNet-5 in architecture (see Y. LeCun, L. Bottou, Y. Bengio, and P. Haffner, "Gradient-based learning applied to document recognition," Proceedings of the IEEE, vol. 86, no. 11, pp. 2278-2324, 1998), but it may diverge from LeNet-5 in its use of modern techniques such as batch normalization after each layer and dropout regularization.

An example system architecture will now be discussed. In the example, the convolutions are both using 3×3 kernels with unit stride and no padding. The pooling layers are both 2×2 max pooling, also unpadded. A rectified linear unit activation function along with dropout may be applied after each convolution and dense layer. There are 36 ⅓ octaves between 6.3 and 20,000 Hz, the 37th row is the overall sound pressure. Each column represents an interpolated sound pressure in time. The number of samples (37) may be considered to be optimized as a hyperparameter.

The model may be trained, such as by using an Adam Optimizer with a learning rate of 0.0004, a dropout keep probability of 0.6, and a bootstrap sample of size 2000 for each batch. 10-fold cross-validation may be used to measure performance.

By way of example, continuing through the flow of FIG. 8, a 37×37×1 data block representing a pre-processed noise event 811 may be fed to a convolutional layer followed by spatial downsampling through 2×2 max-pooling (collectively identified as step 812). After this, the new data block is 17×17×4, meaning that four filters were convolved with the original block. This process is repeated, but this time with eight filters (collectively identified as step 813), producing a 7×7×8 data block. At this point, the data may be transformed to a single feature vector, and the duration of the event before preprocessing may be concatenated on the end. This may then be fed to two subsequent densely connected layers to 40 and 15 neurons respectively (collectively identified as step 814). A final dense layer transforms the data to a softmax of two values (step 815). The two values are non-negative and sum to one, and can be interpreted as the respective probabilities of the sound event being a non-aircraft event or an aircraft event.

The final model may be trained on the entire labeled data set, or on a subset of the data set. The model will continue to improve with the introduction of more labeled data. To this end, the system may employ active learning via uncertainty sampling. This involves measuring the discrete entropy of the probability distribution produced by the softmax layer of the CNN for each event. If it lies above a certain threshold, we mark it for manual labeling. Periodically, these new labeled events may be added to the training set and the model is retrained. These examples will be especially informative during future training rounds, since they likely represent parts of the distribution of events with which the model is unfamiliar.

Figure 10:
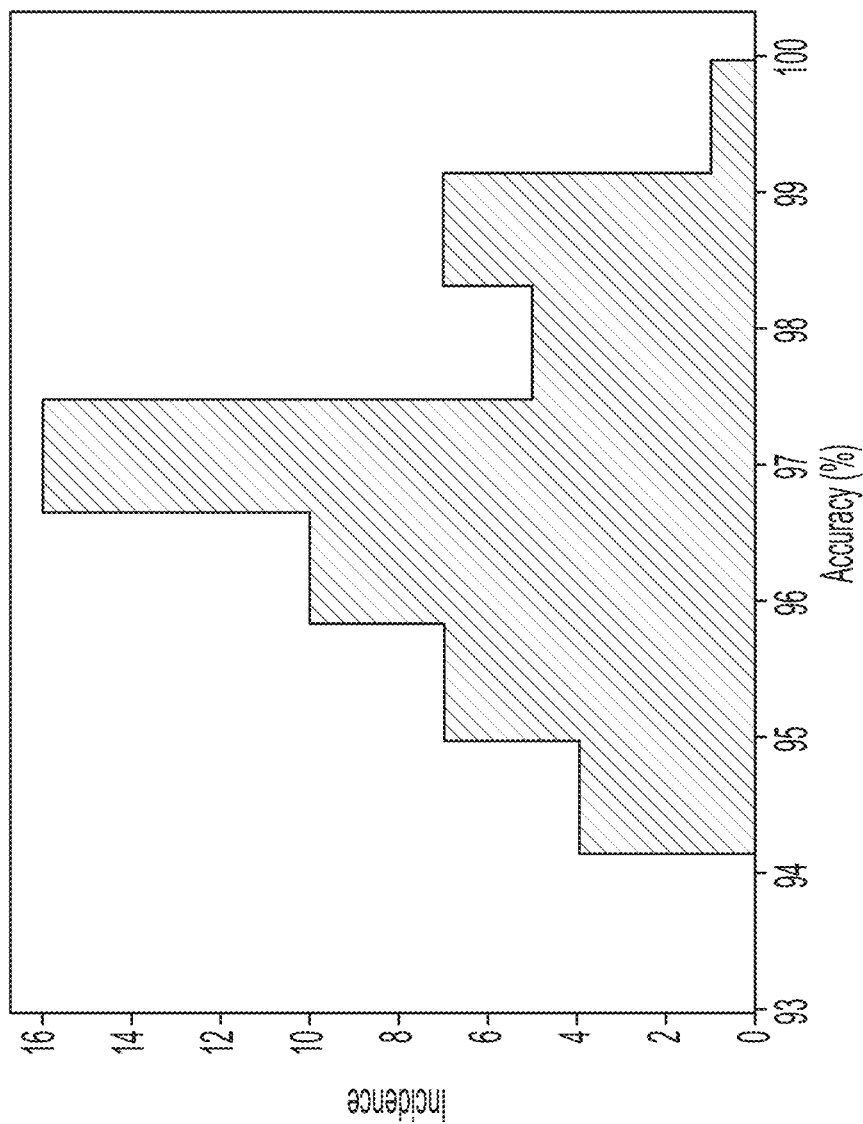
FIG. 10 illustrates a histogram of example final accuracies of training sessions.

In an example data set, the inventors evaluated the performance of the model using 10-fold cross validation. For each fold, the network was trained five times using different random weight initializations in order to produce a faithful measurement of expected performance. When creating the ground truth labels, equal samples were taken from each class in order to avoid class balancing issues during training. Although it should be noted that this is a highly unbalanced problem, with an order of magnitude more aircraft events may be collected. A histogram of the final accuracies of each of the training sessions of this example data set can be seen in FIG. 10. The measurements appear approximately normally distributed. The sample median is 0.970 and the standard deviation is 0.0128. The tightness of this distribution shows reliability of the method.

Other methods of classification of noise may be used in various embodiments, including methods known in the prior art. For example, a classification scheme may be based on analyzing the spectral content of the raw audio data. This uses windowing and then transformation into frequency space using the Fast Fourier Transform, ultimately extracting the Mel Frequency Cepstral Coefficients (MFCC) as features. The method then fit a mixture of Gaussian distributions to the features from each class and used Bayes rule for prediction.

Similarly, the MFCC coefficients may be computed along with some hand-selected features on the 1/24 octave data for each event and fed both to separate feed-forward Artificial Neural Networks (ANNs) for classification. An ANN may be trained on the spectral forms (after some smoothing) of 24-second windows containing sound events to perform this classification.

Some implementations may use a sparse array of several, for example twelve, microphones to provide more attributes about sound events in order to perform the classification.

Figure 11:
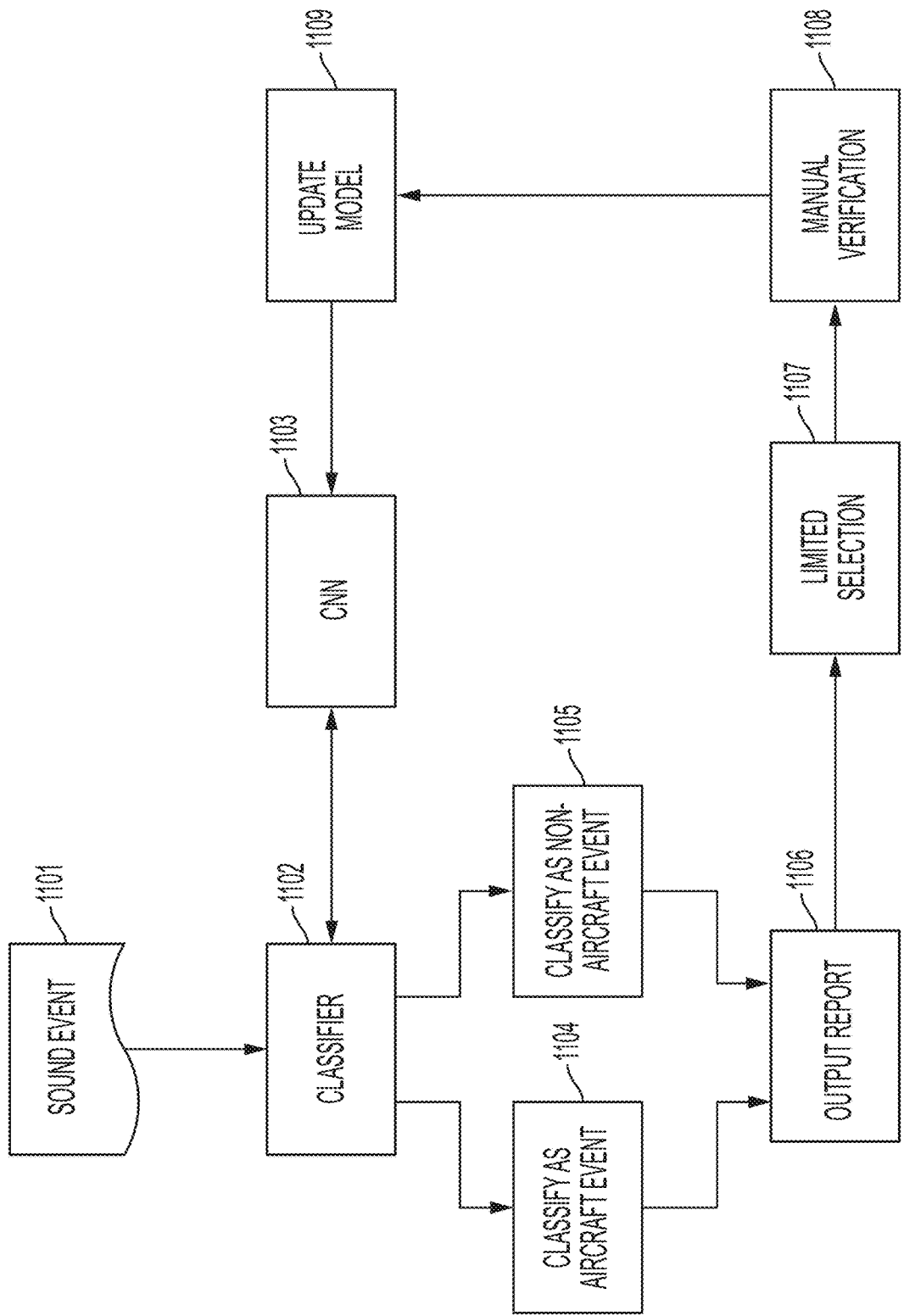
FIG. 11 is a flow diagram of a sound event classification and model updating process.

When the system is trained using a CNN, the model may then be applied to new sound events to classify new sound events as aircraft-related events or non-aircraft related events. For example, referring to FIG. 11, a classifier 1102 may receive a sound event and classify the event as either an aircraft event 1104 or a non-aircraft event 1105 using a trained model with a CNN 1103 as described above. The system may output a report of the classification process 1106, such as by saving the information to memory, displaying it on a display, presenting it via audio output, and/or transmitting it in an electronic message. Some or all of the measured sound events may be sampled 1107 and transferred from the NOMS to the monitoring server periodically (e.g., by being loaded daily). The system may automatically compare the time of classified events to flight track time and location data (as received from a remote flight data source) and/or apply input from human verification to determine whether a noise classification matched the classification depending on whether the results of the classifier and the results of the verification 1108 agree. This result may be used to update the model 1109 which the CNN 1103 can then apply to analyze a new sound event.

When used for classification as described in this document, CNNs employ what is known as a softmax layer at their end. The output of the softmax layer is an array of numbers, where each number is taken to mean the CNN's confidence that the input belongs to the class that that number corresponds to. By construction, these output numbers are all positive and sum to one. For this reason they are often thought of as probabilities, and values close to one represent cases in which the CNN is very confident in its classification decision, where cases where none of the softmax values are close to one represent cases where they CNN has low confidence. Thus, when outputting a result of the classification, the system may consider a threshold for one or the other of the softmax numbers to determine the classification to apply. Alternatively or in addition, the system may output a most likely classification along with a confidence score representing the output of the softmax layer.

Figure 12:
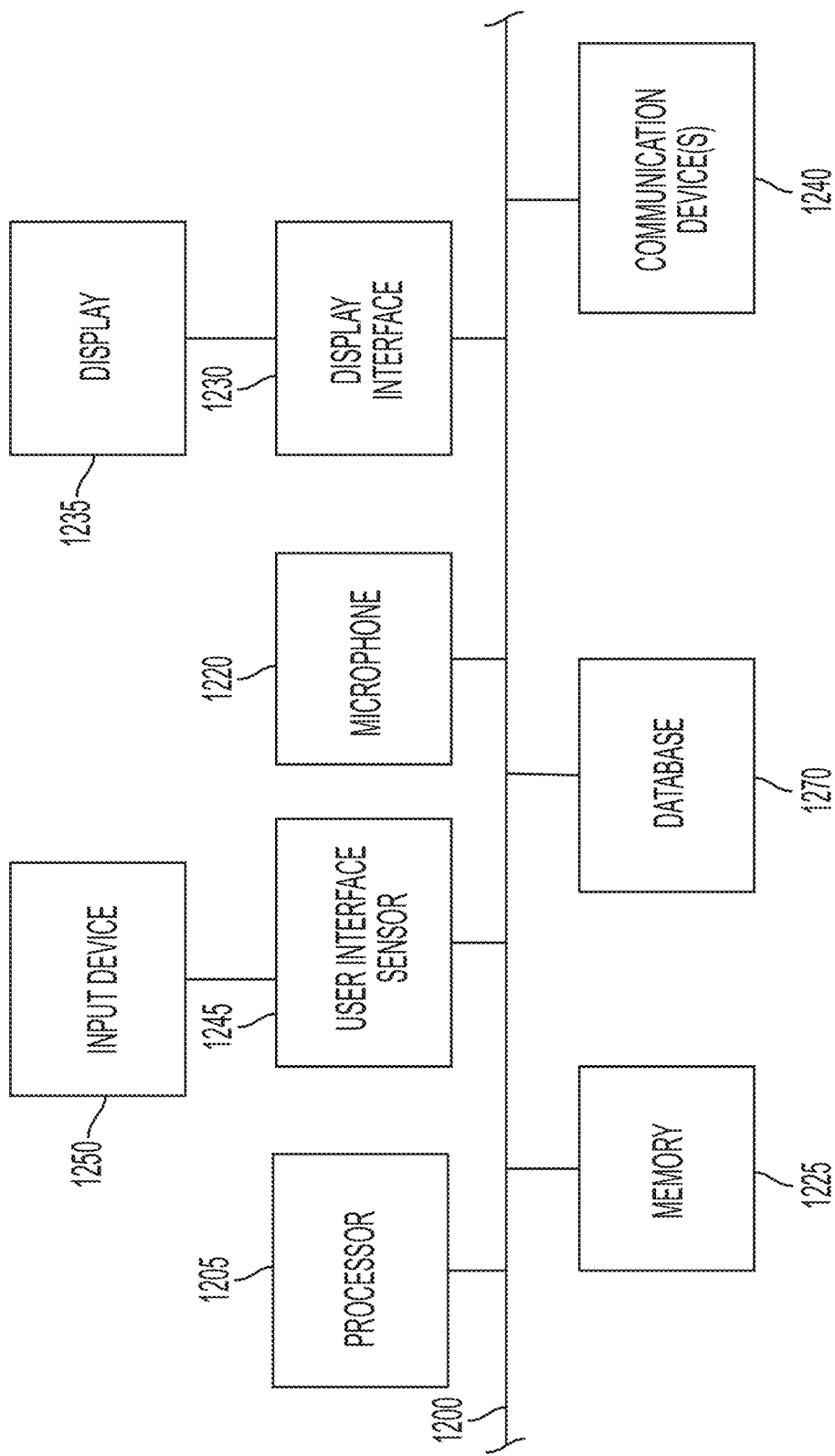
FIG. 12 is a block diagram illustrating various hardware components that a noise monitoring and classification system may employ.

FIG. 12 depicts example hardware components that may be used by the monitoring system or any of its components, such as the classifier. An electrical bus 1200 serves as an information highway interconnecting the other illustrated components of the hardware. Processor 1205 is a central processing device of the system, configured to perform calculations and logic operations required to execute programming instructions, such as may be stored in a memory 1225. As used in this document and in the claims, the terms "processor" and "processing device" may refer to a single processor or any number of processors in a set of processors that collectively perform a set of operations, such as a central processing unit (CPU), a graphics processing unit (GPU), a remote server, or a combination of these. Read only memory (ROM), random access memory (RAM), flash memory, hard drives and other devices capable of storing electronic data constitute examples of memory devices 1225. A memory device may include a single device or a collection of devices across which data and/or instructions are stored.

An optional display interface 1230 may permit information to be displayed on a display device 1235 in visual, graphic or alphanumeric format. An audio interface and audio output (such as a speaker) also may be provided. Communication with external devices may occur using various communication devices 1240 such as a wireless antenna, a communication port and/or a short-range or near-field communication transceiver, each of which may optionally communicatively connect with other components of the device via one or more communication system. The communication device 1240 may be configured to be communicatively connected to a communications network, such as the Internet, a local area network or a cellular telephone data network.

The hardware may also include a user interface sensor 1245 that allows for receipt of data from input devices 1250 such as a keyboard, a mouse, a joystick, a touchscreen, a touch pad, a remote control, a pointing device and/or microphone. Sound events may be received from an external source via the communication device 1240, or from a microphone 1220 that can capture and record digital audio files of sound events. The system also may include or have access to a database 1270 of data that is used in classification, such as flight path data.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. An aircraft noise monitoring system, comprising:
a set of geographically distributed noise sensors;
a processor; and
programming instructions that are configured to instruct the processor to:
 receive data corresponding to events captured by the noise sensors,
  wherein each event corresponds to noise that exceeds a threshold level over at least a minimum period of time,
 transform the data corresponding to the events and the manual classifications of the events into a set of visualizations,
 receive, for each visualization corresponding to an event, a manual classification of the visualization as corresponding to an aircraft noise event or a non-aircraft noise event,
 use the visualizations corresponding to the events and the manual classifications of the visualizations to train a convolutional neural network (CNN) in a classification process,
 receive, from one of the noise sensors, a new noise event,
 transform the data corresponding to the new noise event into a visualization of the new noise event,
 use the CNN to classify the visualization of the new noise event as an aircraft noise event or a non-aircraft noise event, and
 generate an output indicating whether the new noise event is an aircraft noise event or a non-aircraft noise event.

2. The system of claim 1, wherein:
the visualization of the new noise event comprises a visualization of sound pressure level of the noise event over a time window; and
the instructions that are configured to use the CNN to classify the new noise event as an aircraft noise event or a non-aircraft noise event comprise instruction to determine whether the visualization of the sound pressure level of the noise event over the time window corresponds to an aircraft event.

3. The system of claim 2, wherein the instructions to determine whether the visualization of the sound pressure level of the noise event over the time window corresponds to an aircraft event comprise instructions to:
 if the visualization exhibits a shape of a bell curve, determine that the visualization corresponds to an aircraft event;
 otherwise determine that the visualization corresponds to a non-aircraft event.

4. The system of claim 1, wherein:
the visualization of the sound pressure level of the noise event over the time window comprises a three-dimensional visualization representing the sound pressure level on a first axis, time on a second axis, and frequency on a third axis; and
the instructions that are configured to use the CNN to classify the new noise event as an aircraft noise event or a non-aircraft noise event comprise instruction to determine whether the visualization of the sound pressure level of the noise event over the time window corresponds to an aircraft event.

5. The system of claim 4, wherein the instructions to determine whether the visualization of the sound pressure level of the noise event over the time window corresponds to an aircraft event comprise instructions to:
 if the visualization exhibits an oval spectral shape, determine that the visualization corresponds to an aircraft event;
 otherwise determine that the visualization corresponds to a non-aircraft event.

6. The system of claim 1, wherein the instructions to use the data corresponding to the events to train the CNN comprise instructions to preprocess the data to yield sound events having a consistent length.

7. The system of claim 1, wherein the instructions to generate an output comprise instructions to receive an output of a softmax layer of the CNN and use the output of the softmax layer to determine a level of confidence as to whether the new noise event corresponds to an aircraft event.

8. The system of claim 1, wherein:
each of the noise sensors further comprises a sound analyzer; and
the sound analyzers are configured to process sound captured by the noise sensor and identify the events that correspond to noise that exceeds the threshold level over at least the minimum period of time.

9. A method of monitoring an environment to detect aircraft noise, the method comprising:
by a set of geographically distributed noise sensors, capturing data corresponding to a plurality of events, wherein each event corresponds to noise that exceeds a threshold level over at least a minimum period of time; and
by a processor:
receiving the data corresponding to events captured by the plurality of noise sensors,
transforming the data corresponding to the events and the manual classifications of the events into a set of visualizations, receiving, for each visualization corresponding to an event, a manual classification of the visualization as corresponding to an aircraft noise event or a non-aircraft noise event, using the visualizations corresponding to the events and the manual classifications of the visualizations to train a convolutional neural network (CNN) in a classification process, receiving, from one of the noise sensors, a new noise event, transforming the data corresponding to the new noise event into a visualization of the new noise event, using the CNN to classify the visualization of the new noise event as an aircraft noise event or a non-aircraft noise event, and generating an output indicating whether the new noise event is an aircraft noise event or a non-aircraft noise event.

10. The method of claim 9, wherein:

the visualization of the new noise event comprises a visualization of sound pressure level of the noise event over a time window; and using the CNN to classify the new noise event as an aircraft noise event or a non-aircraft noise event comprises determining whether the visualization of the sound pressure level of the noise event over the time window corresponds to an aircraft event.

11. The method of claim 10, wherein determining whether the visualization of the sound pressure level of the noise event over the time window corresponds to an aircraft event comprises:

if the visualization exhibits a shape of a bell curve, determining that the visualization corresponds to an aircraft event;

otherwise determining that the visualization corresponds to a non-aircraft event.

12. The method of claim 9, wherein:

the visualization of the sound pressure level of the noise event over the time window comprises a three-dimensional visualization representing the sound pressure level on a first axis, time on a second axis, and frequency on a third axis; and using the CNN to classify the new noise event as an aircraft noise event or a non-aircraft noise event comprises determining whether the visualization of the sound pressure level of the noise event over the time window corresponds to an aircraft event.

13. The method of claim 12, wherein determining whether the visualization of the sound pressure level of the noise event over the time window corresponds to an aircraft event comprises:

if the visualization exhibits an oval spectral shape, determining that the visualization corresponds to an aircraft event;

otherwise determining that the visualization corresponds to a non-aircraft event.

14. The method of claim 9, wherein using the data corresponding to the events to train the CNN comprises preprocessing the data to yield sound events having a consistent length.

15. The method of claim 9, wherein generating the output comprises receiving an output of a softmax layer of the CNN and using the output of the softmax layer to determine a level of confidence as to whether the new noise event corresponds to an aircraft event.

16. The method of claim 9, wherein capturing the data corresponding to a plurality of events comprises, by each of the noise sensors:

receiving sound; and processing the sound to identify the events that correspond to noise that exceeds the threshold level over at least the minimum period of time.

17. A method of monitoring an environment to detect aircraft noise, the method comprising, by a processor:

receiving data corresponding to events captured by a set of geographically distributed noise sensors, wherein each event corresponds to noise that exceeds a threshold level over at least a minimum period of time;

receiving, for each event, a manual classification of the event as an aircraft noise event or a non-aircraft noise event;

preprocessing the data to yield sound events having a consistent length;

transforming the data corresponding to the events and the manual classifications of the events into a set of visualizations corresponding to the events;

receiving, for each visualization corresponding to an event, a manual classification of the visualization as corresponding to an aircraft noise event or a non-aircraft noise event, using the visualizations corresponding to the events and the manual classifications of the events to train a convolutional neural network (CNN) in a classification process;

receiving, from one of the noise sensors, a new noise event;

transforming the data corresponding to the new noise event into a visualization of the new noise event, using the CNN to generate a classification of the visualization of the new noise event as an aircraft noise event or a non-aircraft noise event;

using an output of a softmax layer of the CNN to determine a level of confidence in the generated classification; and outputting an indication of whether the new noise event is an aircraft noise event or a non-aircraft noise event.

18. The method of claim 17, wherein receiving the data corresponding to a plurality of events comprises, by the processor:

receiving sound captured by the noise sensors; and processing the sound to identify the events that correspond to noise that exceeds the threshold level over at least the minimum period of time.

* * * * *